United States Patent [19]

Capasso

[11] 4,383,269

[45] May 10, 1983

[54] GRADED BANDGAP PHOTODETECTOR

[75] Inventor: Federico Capasso, Westfield, N.J.

[73] Assignee: Bell Telephone Laboratories, Incorporated, Murray Hill, N.J.

[21] Appl. No.: 188,719

[22] Filed: Sep. 19, 1980

[51] Int. Cl.³ .................... H01L 27/14; H01L 29/90; H01L 29/161

[52] U.S. Cl. ........................ 357/30; 357/13; 357/16; 357/90

[58] Field of Search ................. 357/30, 90, 13, 16

[56] References Cited

U.S. PATENT DOCUMENTS 3,995,303 11/1976 Nahong et al. ................ 357/300 R
4,144,540 3/1979 Bottka ........................... 357/300 R

FOREIGN PATENT DOCUMENTS 7423970 2/1976 France ............................ 357/30 F

OTHER PUBLICATIONS

H. C. Casey & M. B. Panish *Heterostructure Lasers*, Academic Press, 1978, Part A, p. 196.
P. Kordos et al., "Growth and Properties of Graded Band-gap $Al_xGa_{1-x}As$ Layers", *Appl. Physics Letters*, vol. 34, No. 6, (1979), pp. 366-368.
W. T. Tsang, et al., "Multidielectrics for GaAs MIS Devices Using Composition-Graded $Al_xGa_{1-x}As$ and Oxidized AlAs", *Applied Physics Letters*, vol. 34, No. 6, (1979), pp. 408-410.

*Primary Examiner*—Martin H. Edlow
*Assistant Examiner*—J. Carroll
*Attorney, Agent, or Firm*—Michael J. Urbano; Richard D. Laumann

[57] ABSTRACT

The invention is a reduced noise avalanche photodetector. The detector comprises a p-type region, an n-type region, and a graded bandgap avalanche region situated between the p- and n-type regions. Radiation to be detected is absorbed in one of the p-type and n-type regions and charge carriers are generated in response thereto.

When the device is under a reverse bias, one type of photogenerated charge carrier is injected by diffusion into the graded bandgap region and initiates an avalanche discharge therein. The carrier type initiating the discharge moves toward a region of decreasing bandgap energy, while the other type of charge carrier moves toward a region of increasing bandgap energy, thus resulting in a large difference between the ionization coefficients of the two types of charge carriers. The differing "quasi-electric" fields experienced by the two types of charge carriers also contributes to the difference between the ionization coefficients of the electrons and holes.

7 Claims, 6 Drawing Figures

GRADED BANDGAP PHOTODETECTOR

TECHNICAL FIELD

This invention pertains to the field of photodetectors and more particularly to the field of reduced noise avalanche photodetectors.

BACKGROUND OF THE INVENTION

In a semiconductor avalanche photodetector, the noise depends upon the ratio of the ionization coefficients of the two types of charge carriers present in semiconductor devices and on the mechanism which initiates carrier multiplication. The ionization coefficient is the probability of the occurrance of an ionizing collision per unit length. A large difference between the ionization coefficients of the electrons and holes results in desirable noise characteristics for an avalanche photodetector, provided that the avalanche is initiated by the carrier type having the larger ionization coefficient. In the ideal avalanche detector, only one type of charge carrier would undergo ionizing collisions. [See McIntyre, R. J., *IEEE Transactions on Electron Devices*, Vol. 13, p. 194 (1966).]

Accordingly, efforts have been directed to developing an avalanche photodetector in which one type of charge carrier has a larger ionization coefficient than the other and in which the avalanche is initiated by the type of charge carrier having the larger ionization coefficient.

In contrast with silicon, many group III-V semiconductor materials exhibit substantially equal ionization coefficients for electrons and holes. It is therefore advantageous to tailor the structure of a photodetector comprising group III-V semiconductors so that the two species of charge carriers do not ionize at substantially the same rate and the avalanche discharge is initiated by the type of charge carrier having the larger ionization coefficient.

SUMMARY OF THE INVENTION

This invention is a low noise avalanche photodetector in which the energy band structure causes one type of charge carrier to ionize at a faster rate than the other type of charge carrier and in which the avalanche discharge is initiated by the type of charge carrier having the larger ionization rate.

In accordance with the invention, the avalanche photodetector comprises a p-type semiconductor end region; an n-type semiconductor end region, and a graded bandgap semiconductor region situated between the p-type and n-type regions. Radiation to be detected is absorbed in one of the p-type and n-type regions and charge carriers are generated in response thereto.

In one preferred embodiment, the avalanche photodetector comprises a single crystalline semiconductor body including: a wide bandgap first end region of a first conductivity type; a graded bandgap intermediate second region contiguous with the first region; and a third end region, contiguous with the second region, having a conductivity type opposite to that of the first region and a bandgap narrower than that of the first region. The second region has a bandgap energy that is graded from a first value near the first region to a second smaller value near the third region.

It is hypothesized that the inventive avalanche photodetector operates as follows. Radiation of a suitable wavelength is absorbed in the wide bandgap first region where hole-electron pairs are generated. When the structure is under a reverse bias, one type of charge carrier is transported by diffusion into the graded bandgap second region. This type of charge carrier initiates an avalanche discharge in the graded bandgap region which is depleted as a result of the applied reverse bias voltage. Advantageously, within the graded bandgap region, the type of charge carrier which initiates the discharge moves toward a region of decreasing bandgap energy and the other type of charge carrier moves toward a region of increasing bandgap energy. Since ionization coefficients exponentially increase with decreasing bandgap, the type of charge carrier moving toward the region of decreasing bandgap has a larger ionization coefficient than the type of charge carrier moving toward the region of increasing bandgap. In addition, the different "quasi-electric" fields (see detailed description) experienced by the holes and electrons in the graded bandgap region, further contribute to the difference in ionization coefficients of the electrons and holes. The difference in ionization coefficients of the two types of charge carriers results in a reduced noise avalanche photodetector so long as the discharge is initiated by the carrier type have the larger ionization coefficient.

Illustratively, the electrons and holes in $Al_xGa_{1-x}As$ are expected to exhibit approximately equal ionization coefficients. However, the principles of this invention indicate that, grading the value of x to form a graded bandgap semiconductor, can result in an $Al_xGa_{1-x}As$ detector in which the ionization coefficients of the electrons and holes are not equal.

Advantageously, it is expected that use of the principles of this invention can result in ratios of ionization coefficients on the order of 10 or more.

BRIEF DESCRIPTION OF THE DRAWINGS

For reasons of clarity, the figures have not been drawn to scale.

DETAILED DESCRIPTION

Figure 1:
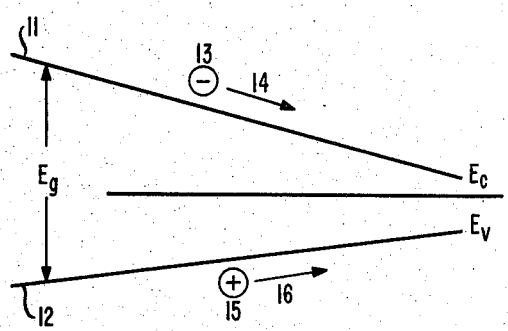
FIG. 1 shows an energy band diagram for a graded bandgap semiconductor useful in explaining the underlying principles of the invention.

FIG. 1 illustrates the energy band structure of one type of graded bandgap semiconductor material in the absence of a space charge electric field. Curve 11 is the lower edge of the conduction band, and curve 12 is the upper edge of the valence band. An electron 13 in the conduction band of FIG. 1 experiences a force of "quasi-electric field" due to the gradient of the conduction band energy $E_c$. This force is indicated by arrow 14. A hole 15 in the valence band of FIG. 1 also experiences a force or a "quasi-electric field" due to the gradient of the valence band energy $E_v$. This force is indicated by arrow 16. It is clear that neither of these forces results from a true electric field, which is always a solution of Maxwell's equations, because charges of opposite sign move in the same direction. (See Kroemer, H., *RCA Review*, Vol. 18, September 1957, p. 332).

For the band structure shown in FIG. 1, the quasi-electric field experienced by the electrons is greater than the quasi-electric field experienced by the holes because the gradient of the conduction band energy $E_c$ exceeds the gradient of the valence band energy $E_v$.

In accordance with one illustrative embodiment of the invention, the reduced noise semiconductor avalanche photodetector comprises: a p-type end region; an n-type end region having a narrower bandgap than the p-type region; and a graded bandgap region, situated between the p-type and n-type regions. The graded bandgap region has a bandgap energy that is graded from a first value near the p-type region to a smaller second value near the narrower bandgap n-type region. Radiation to be detected is absorbed in the p-type wider bandgap region and hole-electron pairs are generated therein.

Figure 2:
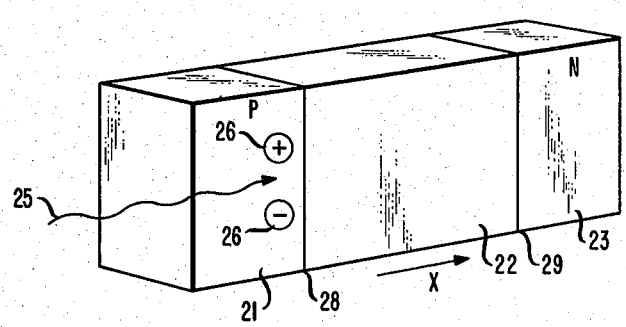
FIG. 2 schematically shows a reduced noise avalanche photodetector in accordance with an illustrative embodiment of the invention.

The above-mentioned illustrative embodiment of the invention is shown in FIG. 2. Region 22 has a graded bandgap and can comprise a low doped p-type semiconductor, a low doped n-type semiconductor, or a compensated semiconductor. Illustratively, region 22 is formed by the material whose energy band structure is shown in FIG. 1. Region 23 is an n-type semiconductor whose bandgap energy is smaller than that of p-type region 21. Alternatively, the wider bandgap region 21 can be n-type and the narrower bandgap region 23 can be p-type.

Figure 3:
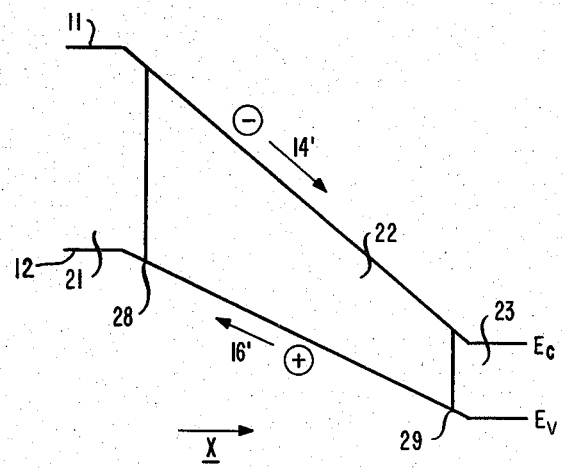
FIG. 3 shows the energy band diagram of the photodetector of FIG. 2.

FIG. 3 shows the band diagram of the device of FIG. 2 when it is under a reverse bias voltage. Corresponding regions in FIGS. 2 and 3 have the same reference numerals. The space charge field produced by the reverse bias voltage is transverse to the layers, i.e., in the x direction. It should be noted that for electrons in the conduction band, the applied space charge electric field and the quasi-electric field exert forces in the same direction (arrows 14 and 14' in FIGS. 1 and 3), whereas for the holes, the space charge electric field and the quasi-electric field exert forces in opposite directions (arrows 16 and 16' in FIGS. 1 and 3).

The following explanation, which is not intended to limit the scope of the claims, can be used to understand the operation of the inventive photodetector shown in FIG. 2. Photons (e.g., 25) of a suitable frequency are absorbed in region 21 where hole-electron pairs (e.g., 26) are generated. Advantageously, the radiation should be absorbed within a diffusion length of interface 28. The photogenerated electrons are injected by diffusion into graded bandgap region 22 which is depleted because of the applied reverse bias voltage. The injected electrons are accelerated by the strong electric field present in the graded bandgap region when the device is under a reverse bias and initiate avalanche multiplication by undergoing ionizing collisions. Within the graded bandgap semiconductor, the electrons in the conduction band move toward a region of decreasing bandgap energy and experience a relatively large total electric field approximately equal to the sum of the space charge electric field and the quasi-electric field. The holes in the valence band of the graded bandgap region move toward a region of increasing bandgap energy and experience a relatively small total electric field approximately equal in magnitude to the difference of the space charge electric field and the quasi-electric field. In general, the ionization coefficient of a species increases exponentially with an increasing electric field and decreases exponentially with an increasing bandgap energy. Physically, the electric field accelerates a charge carrier until it has sufficient energy to undergo an ionizing collision. The ionization energy is approximately given by three halves the bandgap energy ($E_i = 3/2\ E_g$). For the illustrative situation depicted in FIG. 3, the electrons clearly have a larger ionization coefficient than the holes because they are moving under a larger electric field into a region of smaller ionization energy.

In a particular embodiment of the invention, the photodetector of FIG. 2 may be formed from group III-V semiconductors such as $In_xGa_{1-x}As_yP_{1-y}$, $Ga_xAl_{1-x}As$, or $Al_xGa_{1-x}Sb$ which are lattice matched over relatively wide compositional ranges to InP, GaAs, and GaSb respectively.

Illustratively, region 21 of FIG. 2 can comprise $Al_yGa_{1-y}As$, $0 < y \leq 1$; region 23 can comprise $Al_zGa_{1-z}As$, $0 \leq z < 1$, $z < y$; and region 22 can comprise $Al_xGa_{1-x}As$, x being graded from a value substantially equal to y near interface 28 to a value substantially equal to z near interface 29.

Figure 4:
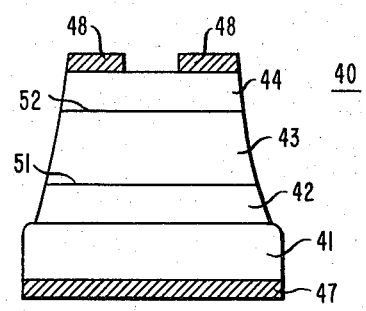
FIG. 4 illustrates an avalanche photodetector comprising $Al_xGa_{1-x}As$ in accordance with an illustrative embodiment of the invention.

An example of such a detector is shown in FIG. 4. This detector is intended to be illustrative only and numerical parameters stated in connection with this particular embodiment of the invention are not intended to be limitations on the scope of the claims. Epitaxially deposited on n-type GaAs substrate 41 is n-type GaAs layer 42 having a doping level of approximately $10^{18}/cm^3$ and a thickness of about 2 microns. Graded bandgap region 43 is contiguous with layer 42. The graded bandgap region is n-type and has a doping level on the order of or less than $10^{15}\ cm^{-3}$. Region 43 comprises $Al_xGa_{1-x}As$ and x is graded from approximately 0.0 near interface 51 to approximately 0.45 near interface 52 over a distance in the approximate range of 0.3 $\mu m$ to 1.5 $\mu m$. P-type layer 44, which comprises $Al_{0.45}Ga_{0.55}As$, is contiguous with region 43 and is about 2 $\mu m$ thick. Layer 44 has a dopant concentration of about $10^{18}/cm^3$. Semiconductor regions 42, 43, 44 are single crystalline and are epitaxially formed using a method such as liquid phase epitaxy or molecular beam epitaxy. (See Kordos, P., et al. "Growth and Properties of Graded Bandgap $Al_xGa_{1-y}As$ Layers", *Applied Physics Letters*, Vol. 34, No. 6, Mar. 15, 1979, pp. 366–368 for an example of a graded bandgap layer grown by LPE; and see Tsang, W. T., et al., "Multi-Dielectrics for GaAs MIS Devices Using Composition Graded $Al_xGa_{1-x}As$ and Oxidized AlAs", *Applied Physics Letters*, Vol. 34, No. 6, Mar. 15, 1979, p. 408 for an example of a graded bandgap layer grown by MBE). Illustratively, detector 40 of FIG. 4 has a mesa geometry. The graded bandgap region may be continuously graded or may be formed by a plurality of discrete layers ordered in such a way that the bandgap increases from interface 51 to interface 52. A reverse bias in the approximate range of 15–150 volts, depending on the thickness of the graded region, is applied using ohmic contacts 47 and 48 which are contiguous with the substrate and layer 44 respectively. Advantageously, under the reverse bias voltage, the graded bandgap region is substantially depleted and the space charge electric field is substantially constant. Contact 48 is apertured in order to couple radiation into the detector. Detector 40 is sensitive to radiation having wavelengths in the range of about 0.62 μm to 0.87 μm.

$Al_xGa_{1-x}As$ is a direct bandgap material for $0.0 < x < 0.45$. In this range, approximately 85 percent of the bandgap gradient is in the conduction band and the remaining approximately 15 percent of the bandgap gradient is in the valence band. (See Casey, H. C., and Panish, M. B., "Heterostructure Lasers", Academic Press 1978; Part A, p. 196.) Thus, in the case of the detector shown in FIG. 4, the electrons experience a larger quasielectric field than the holes.

Figure 5:
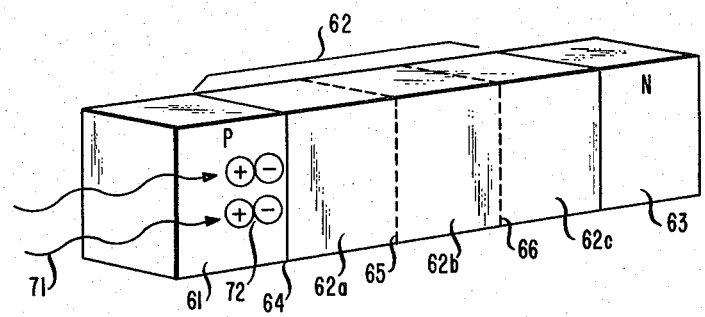
FIG. 5 schematically shows a reduced noise avalanche photodetector in accordance with an alternative illustrative embodiment of the invention.
Figure 6:
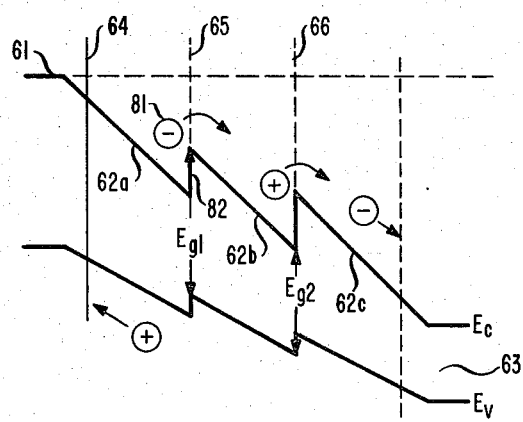
FIG. 6 shows the energy band diagram of the photodetector of FIG. 5.

An alternative embodiment of the invention is shown in FIG. 5. FIG. 6 shows the energy band diagram of the device of FIG. 5 when it is under a reverse bias voltage. Corresponding elements in FIGS. 5 and 6 have the same reference numerals.

In the embodiment of the invention illustrated in FIGS. 5 and 6, end region 61 comprises a p-type semiconductor. End region 63 comprises an n-type semiconductor having a narrower bandgap than that of region 61. Alternatively, wider bandgap region 61 can be n-type and narrower band region 63 can be p-type. Region 62 is situated between end regions 61 and 63 and comprises a plurality of zones 62a, 62b, and 62c. Zone 62a is contiguous with region 61 and zone 62c is contiguous with region 63. Region 62 can comprise a low doped p-type semiconductor, a low doped n-type semiconductor, or a compensated semiconductor. Each zone has a bandgap that is graded from a first value in the portion of the zone nearest region 61 to a smaller second value in the portion of the zone nearest region 63. For example, the bandgap of zone 62b is graded from a value ($Eg_1$) near interface 65 to a smaller value ($Eg_2$) near interface 66. In alternative embodiments of the invention, region 62 can comprise more or fewer than three graded bandgap zones. Each of zones 62a, 62b and 62c of FIGS. 5 and 6 can be formed from a material having an energy band structure of the type shown in FIG. 1.

In this case, the inventive detector of FIGS. 5 and 6 is hypothesized to operate as follows. Photons (e.g., 71) of the proper frequency can be absorbed in region 61 where hole-electron pairs (e.g., 72) are generated. Advantageously, the radiation should be absorbed within a diffusion length of interface 64. The photogenerated electrons are injected by diffusion into region 62 which is depleted because of the applied reverse bias voltage. The injected electrons are accelerated by the strong electric field present in region 62 when the device is under a reverse bias voltage and initiate avalanche multiplication by undergoing ionizing collisions. Electrons in the conduction band of zone 62a experience a decreasing bandgap energy and total electric field substantially equal to the sum of the space charge electric field and the quasi-electric field. The holes in the valence band of zone 62a experience an increasing bandgap energy and a smaller total electric field substantially equal in magnitude to the difference of the space charge electric field and the quasi-electric field. Thus, the electrons in zone 62a have a larger ionization coefficient than holes in region 62a. As a result of having a high "temperature" ($\geq 0.5$ eV) many of the electrons (e.g., 81) in zone 62a can overcome barrier 82 when they reach interface 65 and enter into zone 62b where they undergo additional ionizing collisions while experiencing a deceasing bandgap energy and a relatively large electric field. Upon reaching interface 66, many of the hot electrons enter into region 62c where still further ionizing collisions can take place, thus causing enhanced detector gain resulting from the cascading of a plurality of graded bandgap zones.

The embodiment of the invention illustrated in FIGS. 5 and 6 can often operate at a lower reverse bias voltage than the embodiment of the invention shown in FIG. 2 because the gain of the avlanche detector increases with increasing length of the avalanche region which can be longer in the embodiment of FIG. 5 than in the embodiment of FIG. 2. Thus, in the embodiment of the invention shown in FIG. 5, a relatively large gain can be obtained for a relatively small applied electric field and correspondingly smaller ionization coefficients.

In addition, the ionization coefficients depend more strongly on the electric field and the bandgap energy at lower values of the field than at higher values of the field. (See Sze, S. M., "Physics of Semiconductor Devices", John Wiley and Sons, 1969, p. 59–65.) As a result, the difference in the ionization coefficients of the two types of charge carriers is larger at lower values of the applied electric field.

Illustratively, region 61 of FIG. 5 comprises p-type $Al_{0.45}Ga_{0.55}As$, is about 2 microns thick, and has a dopant concentration of about $10^{18}/cm^3$. Each of zones 62a, 62b, and 62c can comprise low doped (about $10^{15}/cm^3$) n-type $Al_xGa_{1-x}As$ where x is graded from approximately 0.45 to approximately 0.0 over distances in the range of approximately 0.1 μm to approximately 0.3 μm. Region 63 can comprise n-type GaAs having a dopant concentration of about $10^{18}/cm^3$ and a thickness of about 2 μm. Advantageously, all of these regions are single crystalline and can be epitaxially deposited on an n-type GaAs substrate (not shown) using molecular beam epitaxy.

Finally, it is to be understood that the above-described devices are only illustrative of the principles of the present invention. In accordance with these principles, numerous structural configurations may be devised by those skilled in the art without departing from the spirit and scope of the invention. In particular, for some purposes, one or more additional layers may be interposed intermediate the two end layers of the inventive devices for a thickness small enough so as not to substantially interfere with the operation of the devices.

I claim:

1. In a semiconductor avalanche photodetector, a single crystalline semiconductor body comprising:
   a first region of a first conductivity type;
   a second region contiguous with said first region; and
   a third region, contiguous with said second region of a conductivity type opposite to said first conductivity type characterized in that:
   said first region has a wider bandgap than said third region and is capable of absorbing radiation to be detected and generating charge carriers in response thereto; and
   said second region has a bandgap that is graded from a first bandgap energy near said first region to a smaller second bandgap energy near said third region.

2. The photodetector of claim 1 wherein said first, second, and third regions comprise group III-V semiconductors.

3. The photodetector of claim 1 wherein:
   said first bandgap energy is substantially equal to the bandgap energy of said first region; and
   said smaller second bandgap energy is substantially equal to the bandgap energy of said third region.

4. The photodetector of claim 3 wherein:

said first region comprises $Al_yGa_{1-y}As$, $0<y\leq 1$;

said third region comprises $Al_zGa_{1-z}As$, $0\leq z<1$, $z<y$; and said second rgion comprises $Al_xGa_{1-x}As$, x being graded from a value substantially equal to y near said first region to a value substantially equal to z near said third region.

5. In a semiconductor avalanche photodetector, a single crystalline semiconductor body comprising:

a first region of a first conductivity type;

a second region contiguous with said first region; and a third region, contiguous with said second region, of a conductivity type opposite to said first conductivity type characterized in that:

said first region has a wider bandgap than said third region and is capable of absorbing radiation to be detected and generating charge carriers in response thereto; and said second region comprises a plurality of contiguous zones, one of which is contiguous with said first region and one of which is contiguous with said third region, each of said zones having a bandgap that is graded from a first value in the portion of the zone nearest the first region to a smaller second value in the portion of the zone nearest the third region.

6. In a semiconductor avalanche photodetector, a semiconductor body comprising:

a first region of a first conductivity type;

a second region of a conductivity type opposite to said first conductivity type; and a graded bandgap region situated between said first and second regions;

one of said first and second regions being capable of absorbing radiation to be detected and generating charge carriers in response thereto.

7. In a semiconductor avalanche photodetector, a single crystalline semiconductor body comprising:

a first region of a first conductivity type;

a second region contiguous with said first region; and a third region, contiguous with said second region of a conductivity type opposite to said first conductivity type CHARACTERIZED IN THAT:

said first region has a greater bandgap energy than said third region and is capable of absorbing radiation to be detected and generating charge carriers in response thereto; and said second region has a bandgap that is graded from a first bandgap energy near said first region to a second smaller bandgap energy near said third region and is capable of causing the avalanche multiplication of charge carriers therein when said device is under a reverse bias.

* * * * *

UNITED STATES PATENT AND TRADEMARK OFFICE
CERTIFICATE OF CORRECTION

PATENT NO. : 4,383,269

DATED : May 10, 1983

INVENTOR(S) : Federico Capasso

It is certified that error appears in the above—identified patent and that said Letters Patent is hereby corrected as shown below:

Column 2, line 64, "force of" should read --force or--.

Signed and Sealed this

Sixteenth Day of August 1983

[SEAL]

Attest:

GERALD J. MOSSINGHOFF

Attesting Officer     Commissioner of Patents and Trademarks